US008926343B2

(12) United States Patent  (10) Patent No.: US 8,926,343 B2
Mason et al.  (45) Date of Patent: Jan. 6, 2015

(54) ELECTRICAL INTERCONNECT DEVICE EMPLOYING AN ARRAY OF CONDUCTIVE ELASTOMER COLUMNS

(71) Applicant: Tyco Electronics Corporation, Berwyn, PA (US)

(72) Inventors: Jeffery Walter Mason, North Attleboro, MA (US); Wayne Stewart Alden, III, Whitman, MA (US)

(73) Assignee: Tyco Electronics Corporation, Berwyn, PA (US)

( * ) Notice: Subject to any disclaimer, the term of this patent is extended or adjusted under 35 U.S.C. 154(b) by 138 days.

(21) Appl. No.: 13/679,535

(22) Filed: Nov. 16, 2012

(65) Prior Publication Data

US 2014/0141632 A1    May 22, 2014

(51) Int. Cl.
  *H01R 4/58*   (2006.01)
  *H01R 13/24*   (2006.01)
  *H01R 12/71*   (2011.01)
  *H05K 7/10*   (2006.01)

(52) U.S. Cl.
  CPC .......... *H01R 13/2414* (2013.01); *H01R 12/714* (2013.01); *H05K 7/1053* (2013.01)
  USPC .......................................................... 439/91

(58) Field of Classification Search
  USPC .................. 439/65, 66, 86, 91, 591; 257/737
  See application file for complete search history.

(56) References Cited

U.S. PATENT DOCUMENTS

| 5,854,514 | A  | * | 12/1998 | Roldan et al. ................. 257/746 |
| 6,007,349 | A  | * | 12/1999 | Distefano et al. ............... 439/71 |
| 6,274,820 | B1 | * | 8/2001  | DiStefano et al. ............. 174/254 |
| 6,848,914 | B2 | * | 2/2005  | Beaman et al. ................. 439/66 |
| 7,241,680 | B2 | * | 7/2007  | Boggs et al. .................. 438/613 |
| 7,385,288 | B2 | * | 6/2008  | Boggs et al. .................. 257/737 |

* cited by examiner

*Primary Examiner* — Vanessa Girardi

(57) ABSTRACT

An electrical interconnect device includes an array of conductive elastomeric columns, each of the elastomeric columns extending between a first end and a second end and being internally conductive between the first and second ends. Upper and lower holders cover the array of conductive elastomeric columns. The upper holder has an upper substrate and a plurality of discrete upper pads held by the upper substrate and arranged in a complementary pattern to the array of elastomeric columns. The discrete upper pads cap corresponding first ends of the elastomeric columns. The lower holder has a lower substrate and a plurality of discrete lower pads held by the lower substrate and arranged in a complementary pattern to the array of elastomeric columns. The discrete lower pads cap corresponding second ends of the elastomeric columns. The upper and lower holders support the array of conductive elastomeric columns.

20 Claims, 3 Drawing Sheets

ELECTRICAL INTERCONNECT DEVICE EMPLOYING AN ARRAY OF CONDUCTIVE ELASTOMER COLUMNS

BACKGROUND OF THE INVENTION

The subject matter herein relates generally to electrical interconnect devices for use between opposed arrays of contacts.

Interconnect devices are used to provide electrical connection between two or more opposing arrays of contacts for establishing at least one electrical circuit, where the respective arrays may be provided on a device, printed circuit board, Pin Grid Array (PGA), Land Grid Array (LGA), Ball Grid Array (BGA), and the like. In one interconnect technique, the electrical connection is provided by an interconnect device that is physically interposed between corresponding electrical contacts of the opposing arrays of contacts. However, the electrical connection may be unreliable due to height variations between electrical contacts of the opposing arrays, variations in thickness of a substrate supporting either of the opposing arrays or the conductive elements of the interconnect device, warping of a substrate of either of the opposing arrays, and the like.

At least some known interconnect devices use an array of elastomeric columns supported on a substrate, The elastomeric columns may be compressed to establish reliable contact between the opposing contacts. In some known interconnect devices, the elastomeric columns are conductive and provide the electrical connection. In other known interconnect devices, the elastomeric columns are non-conductive and the electrical connection is provided via a separate contact or trace. The interconnect devices are capable of accommodating size constraints, such as related to the reduced physical size of many electrical devices.

In known interconnect devices using conductive elastomeric columns, the elastomeric columns are held together by a center supporting substrate. During manufacture, an array of holes is drilled through the center supporting substrate and the elastomeric columns are molded or cast in place in the holes. The center supporting substrate supports each of the elastomeric columns and holds the relative positions of the elastomeric columns, However, as the density of the interconnect devices increases, the pitch between the elastomeric columns decreases. Forming the holes on the supporting substrate at the desired pitches has become problematic, A need remains for an electrical interconnect device that arranges the elastomeric columns on tight pitches.

BRIEF DESCRIPTION OF THE INVENTION

In one embodiment, an electrical interconnect device is provided having an array of conductive elastomeric columns, each of the elastomeric columns extending between a first end and a second end and being internally conductive between the first and second ends. Upper and lower holders cover the array of conductive elastomeric columns. The upper holder has an upper substrate and a plurality of discrete upper pads held by the upper substrate and arranged in a complementary pattern to the array of elastomeric columns. The discrete upper pads cap corresponding first ends of the elastomeric columns. The lower holder has a lower substrate and a plurality of discrete lower pads held by the lower substrate and arranged in a complementary pattern to the array of elastomeric columns. The discrete lower pads cap corresponding second ends of the elastomeric columns. The upper and lower holders support the array of conductive elastomeric columns.

Optionally, the elastomeric columns may be contained between the upper and lower holders and the elastomeric columns may be supported only by the upper and lower holders. The electrical interconnect device may be devoid of a central supporting substrate supporting the elastomeric columns between the upper substrate and the lower substrate. A compression gap may be defined between the upper and lower substrates surrounding the elastomeric columns and filed with air.

Optionally, the elastomeric columns may each include a top section, a mid-section, and a bottom section each generally ⅓ of the elastomeric column between the first and second ends. The top sections may be held by the upper holder, the bottom sections may be held by the lower holder, and the mid-sections may be unsupported relative to each other. The mid-sections may be free of a central supporting substrate supporting the elastomeric columns. Air gaps may surround the elastomeric columns along the entire length between the upper substrate and the lower substrate.

Optionally, the upper substrate may include a flexible film, and the lower substrate may include a flexible film. The upper pads may be held together by the upper substrate and the lower pads may be held together by the lower substrate. The upper substrate may have an upper surface and a lower surface with an array of openings therethrough. The upper pads may be deposited on the upper surface over corresponding openings. The first ends of the elastomeric columns may extend into corresponding openings to engage corresponding upper pads. The elastomeric columns may bulge outward at mid-sections thereof when the upper holder is subjected to a compressive force.

DETAILED DESCRIPTION OF THE INVENTION

Figure 1:
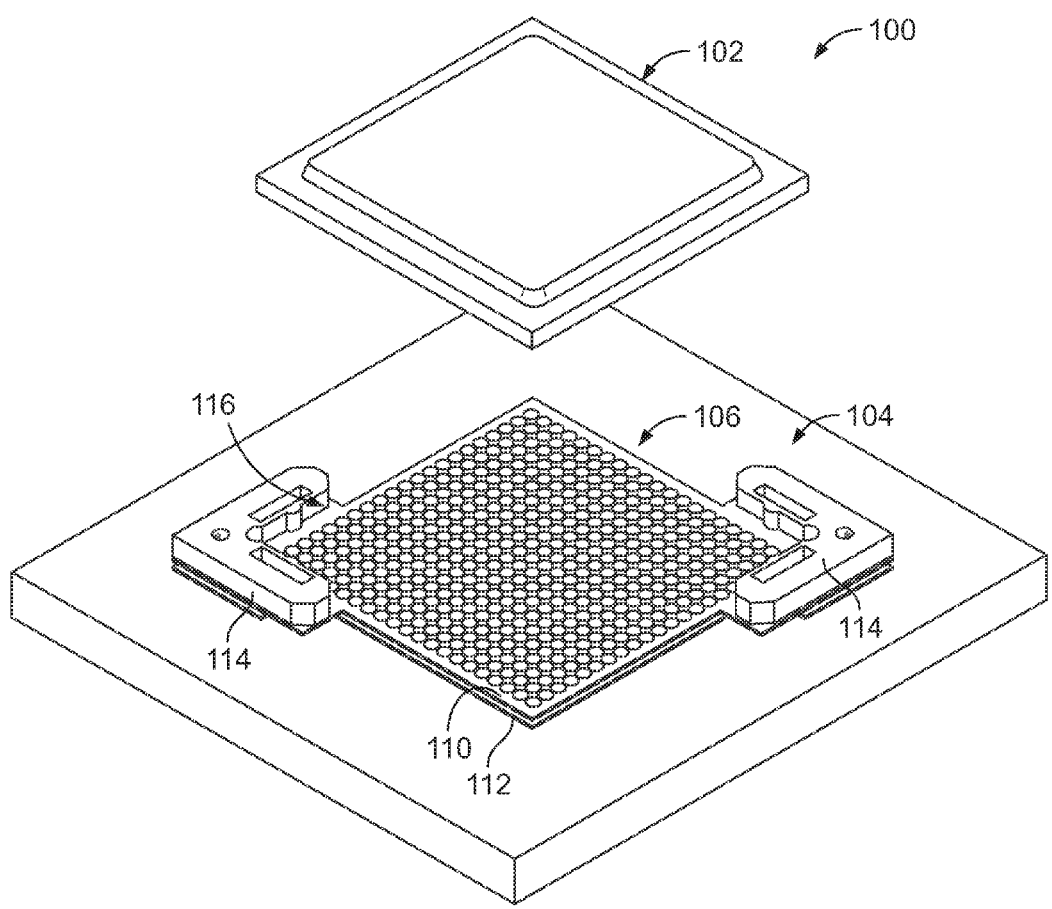
FIG. 1 illustrates an electrical interconnect system formed in accordance with an exemplary embodiment.

FIG. 1 illustrates an electrical interconnect system 100 formed in accordance with an exemplary embodiment. The system 100 includes a first electrical component 102, a second electrical component 104, and an interconnect device 106 sandwiched therebetween. The interconnect device 106 is illustrated mounted to the second electrical component 104. The first electrical component 102 is illustrated poised for mounting to the interconnect device 106. The first and second electrical components 102, 104 both have arrays of contacts, such as land grid arrays, ball grid arrays and the like that are electrically connected together by the interconnect device 106.

In the illustrated embodiment, the first electrical component 102 is an electronic package, such as a chip or processor. The second electrical component 104 is a circuit board. The interconnect device 106 constitutes a socket that is mounted to the circuit board and is configured to receive the chip. In an exemplary embodiment, the electrical interconnect system 100 constitutes a testing system, where the interconnect device 106 is a test socket mounted to a main circuit board, represented by the second electrical component 104. The first electrical component 102 is a test chip configured to be tested in the test socket. One example of a test socket is a burn-in socket used for testing components of the test chip, such as the materials used for manufacturing the chip, at high temperatures, such as a temperature of 150° C. or higher. The test socket is configured for a high volume of cycles during its lifetime, wherein many different test chips are configured to be tested by the test socket. In alternative embodiments, other types of electrical components may be interconnected by the interconnect device 106. For example, both the first and second electrical components 102, 104 may be circuit boards.

The interconnect device 106 has a first mating surface 110 and a second mating surface 112. The first mating surface 110 is configured to be electrically connected to the first electrical component 102. The second mating surface 112 is configured to be electrically connected to the second electrical component 104. The interconnect device 106 includes guide walls 114 that define a receptacle or socket 116 that receives the first electrical component 102. The guide walls 114 align the first electrical component 102 in the socket 116.

Figure 2:
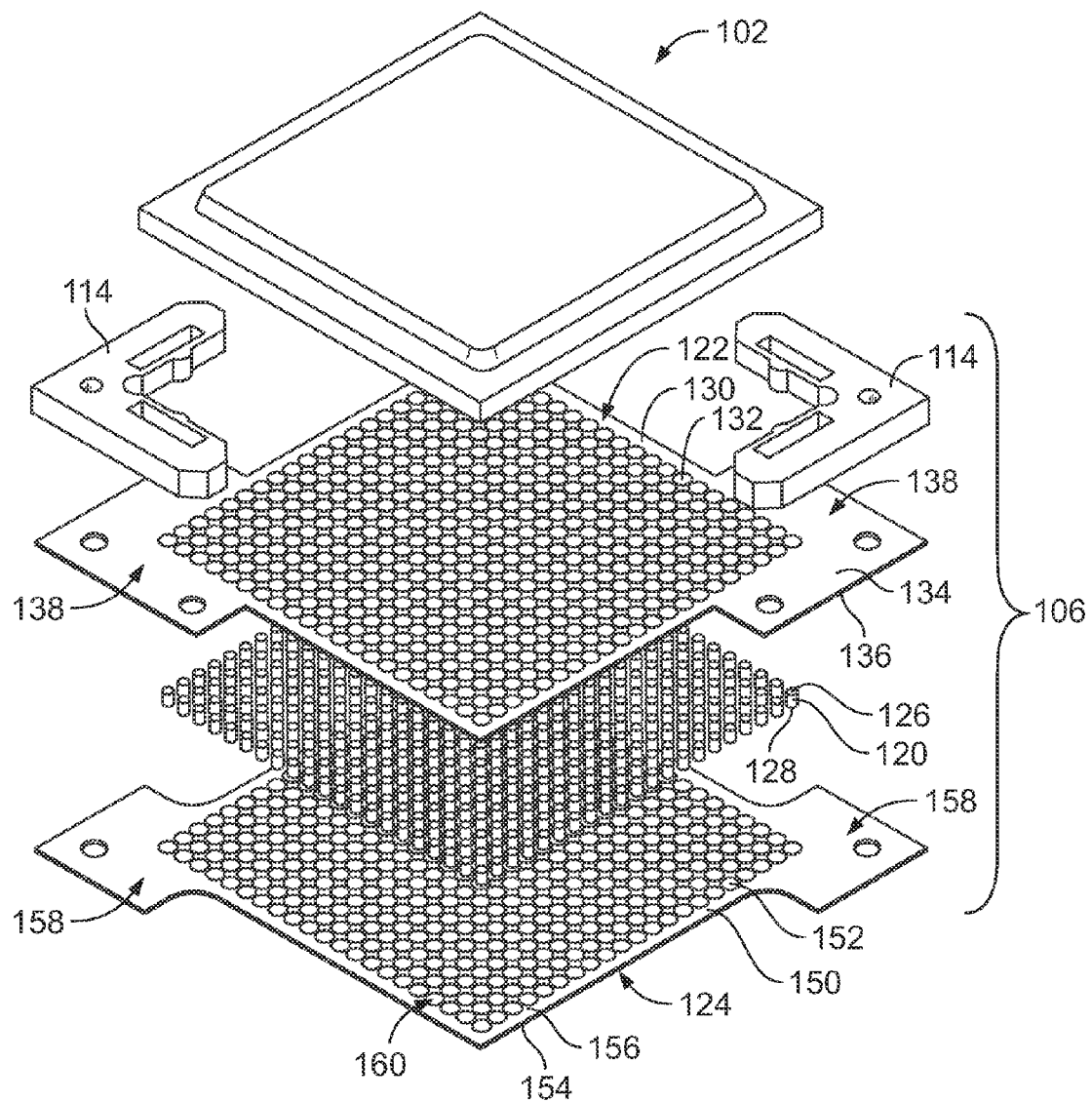
FIG. 2 is an exploded view of the interconnect device in accordance with an exemplary embodiment.

FIG. 2 is an exploded view of the interconnect device 106 in accordance with an exemplary embodiment showing the first electrical component 102 positioned above the interconnect device 106. The interconnect device 106 includes an array of elastomeric columns 120, an upper holder 122 for covering the top of the array of elastomeric columns 120, and a lower holder 124 for covering the bottom of the array of elastomeric columns 120.

The upper and lower holders 122, 124 are used to support and hold the elastomeric columns 120. The upper and lower holders 122, 124 contain the elastomeric columns 120 therebetween. In an exemplary embodiment, when assembled, the elastomeric columns 120 are supported only by the upper and lower holders 122, 124. No central supporting substrate is used to support the elastomeric columns 120 as is typical of conventional interconnects. The columns 120 may be placed on tight pitches, and the pitches are not dependent on limitations in manufacturing a central supporting substrate.

The elastomeric columns 120 are arranged in an array having a predetermined pattern or layout that corresponds to the array of contacts of the first electrical component 102 and the second electrical component 104. The elastomeric columns 120 extend between a first end 126 and a second end 128 opposite the first end 126. In an exemplary embodiment, the columns 120 may be generally cylindrical in shape, however other shapes are possible. For example, the ends of the columns 120 may be frustoconically shaped, being wider about the mid-section and narrower at the first and second ends 126, 128. In an exemplary embodiment, the columns 120 are conductive elastomeric columns, such as columns fabricated from a mixture of an elastic material and conductive particles, such as silver or other metal particles or conductive nanoparticles. The columns 120 provide conductive paths internally between the first and second ends 126, 128, In an exemplary embodiment, the columns 120 form metalized particle interconnects. The columns 120 are at least partially compressible when the first electrical component 102 is mounted to the interconnect device 106.

The upper holder 122 includes an upper substrate 130 and an array of discrete, conductive upper pads 132. Optionally, the upper substrate 130 may be a flexible film. The upper substrate 130 may fabricated from an insulative material, such as a polyimide material that may be arranged as a polyimide film, such as a Kapton™ material. The upper substrate 130 includes an upper surface 134 and a lower surface 136 that generally faces the lower holder 124. The upper substrate 130 includes mounting sections 138. The guide walls 114 are mounted to the mounting sections 138. For example, the guide walls 114 may include pins or posts (not shown) that extend through corresponding openings in the mounting sections 138 to position the guide walls 114 on the upper holder 122.

The conductive upper pads 132 are supported by the upper substrate 130. The upper pads 132 are manufactured from a conductive material, such as copper, gold or other metal, or conductive polymers. The upper pads 132 are arranged in a complementary pattern as the array of elastomeric columns 120. Optionally, the upper pads 132 may be deposited on the upper surface 134. For example, a metal sheet may be applied to the upper substrate 130 and portions of the metal sheet may be etched away or otherwise removed from the upper substrate 130 leaving the upper pads 132. Alternatively, the upper pads 132 may be individually secured to the upper substrate 130. The upper pads 132 may be formed on the upper substrate 130, such as by a coating or plating process. The upper pads 132 may be provided on the lower surface 136 in alternative embodiments. In other alternative embodiments, the upper pads 132 may be held at an intermediate position between the upper and lower surfaces 134, 136. The upper pads 132 are physically held together by the upper substrate 130 such that each of the upper pads 132 may be mounted to the array of elastomeric columns 120 as a unit. The upper pads 132 are arranged on the upper substrate 130 such that the upper pads 132 are spaced apart from one another. The upper pads 132 are electrically isolated from one another by the spacing between the upper pads 132.

The upper holder 122 is positioned relative to the array of elastomeric columns 120 such that the upper pads 132 engage the first ends 126 of corresponding elastomeric columns 120. Optionally, the upper substrate 130 may include openings 140 (shown in FIG. 3) therethrough being aligned with and exposing the upper pads 132 that allow the first ends 126 of the columns 120 to pass through the upper substrate 130 to engage the upper pads 132. When the upper holder 122 is coupled to the array of elastomeric columns 120, the upper holder 122 holds the columns 120 relative to one another. The upper pads 132 are configured to engage corresponding mating contacts of the first electrical component 102 to define an electrical interface between the first electrical component 102 and the elastomeric columns 120.

In an exemplary embodiment, when the first electrical component 102 is mated to the interconnect device 106, the first electrical component 102 compresses the elastomeric columns 120. The upper holder 122 moves with the first electrical component 102 to compress the columns 120. The upper pads 132 remain pressed against the first ends 126 of the elastomeric columns 120 during the entire time the upper substrate 130 and first electrical component 102 are pressed downward. Optionally, features may be provided to limit compression, such as by bottoming out the upper substrate and/or the first electrical component 102.

The lower holder 124 includes a lower substrate 150 and an array of discrete, conductive lower pads 152. Optionally, the lower substrate 150 may be a flexible film. The lower substrate 150 may fabricated from an insulative material, such as a polyimide material that may be arranged as a polyimide film, such as a Kapton™ material. The lower substrate 150 includes a lower surface 154 and an upper surface 156 that generally faces the upper holder 122. The lower substrate 150 includes mounting sections 158. The mounting sections 158 are aligned with the mounting sections 138. The pins or posts of the guide walls 114 extend through both mounting sections 138, 158 to align the upper and lower holders 122, 124 with each other and to align the guide walls 114 to the upper and lower holders 122, 124.

The conductive lower pads 152 are supported by the lower substrate 150. The lower pads 152 are manufactured from a conductive material, such as copper, gold or other metal, or conductive polymers. The lower pads 152 are arranged in a complementary pattern as the array of elastomeric columns 120. Optionally, the lower pads 152 may be deposited on the lower surface 154. The lower pads 152 may be provided on the upper surface 156 in alternative embodiments. In other alternative embodiments, the lower pads 152 may be held at an intermediate position between the lower and upper surfaces 154, 156. The lower pads 152 are physically held together by the lower substrate 150 such that each of the lower pads 152 may be mounted to the array of elastomeric columns 120 as a unit. The lower pads 152 are arranged on the lower substrate 150 such that the lower pads 152 are spaced apart from one another. The lower pads 152 are electrically isolated from one another by the spacing between the lower pads 152.

The lower holder 124 is positioned relative to the array of elastomeric columns 120 such that the lower pads 152 engage the second ends 128 of corresponding elastomeric columns 120. Optionally, the lower substrate 150 may include openings 160 therethrough aligned with and exposing the lower pads 152 that allow the second ends 128 of the columns 120 to pass through the lower substrate 150 to engage the lower pads 152. When the lower holder 124 is coupled to the array of elastomeric columns 120, the lower holder 124 holds the columns 120 relative to one another. The lower pads 152 are configured to engage corresponding mating contacts of the second electrical component 104 (shown in FIG. 1) to define an electrical interface between the second electrical component 104 and the elastomeric columns 120.

Figure 3:
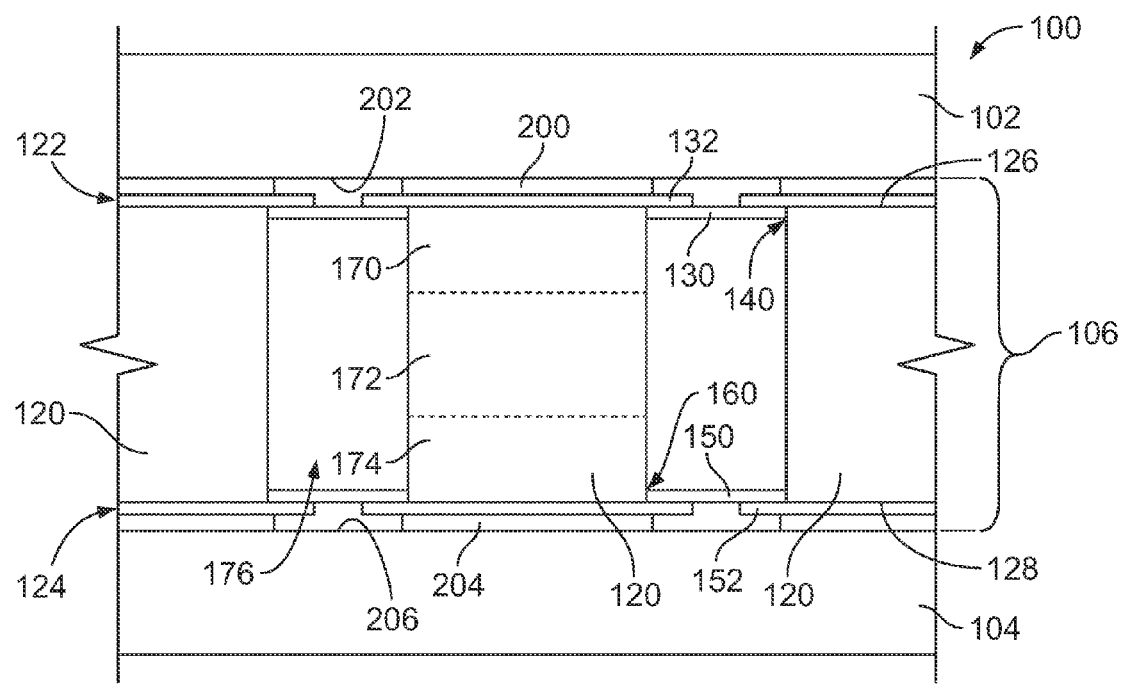
FIG. 3 is a cross-sectional view of the electrical interconnect system showing the interconnect device between first and second electrical components.

FIG. 3 is a cross-sectional view of the electrical interconnect system 100 showing the interconnect device 106 between the first and second electrical components 102, 104. The first electrical component 102 is mounted to the interconnect device 106 such that the upper pads 132 engage mating contacts 200 on a mating surface 202 of the first electrical component 102. The interconnect device 106 is mounted to the second electrical component 104 such that the lower pads 152 engage mating contacts 206 on a mating surface 208 of the second electrical component 104.

In an exemplary embodiment, the elastomeric columns 120 are manufactured in place on the lower holder 124. For example, a mold or die may be positioned over the lower holder 124, the die having openings that define the elastomeric columns 120. The material forming the columns 120 fills the die openings. The material may be at least partially cured, allowing the removal of the die. Upon removal of the die, the columns 120 remain in place on the lower holder 124. For example, when the columns 120 are cured, the columns 120 adhere to, or are otherwise fixed to the lower holder 124. The columns 120 may be directly fixed to the lower pads 152. Once the die is removed, the upper holder 122 may be aligned with the array of columns 120 and secured to the columns 120. For example, the columns 120 may be secured to the upper pads 132 by applying heat and/or pressure to fix the columns 120 to the upper pads 132. The columns 120 are free-standing between the upper and lower holders 122, 124, without the need for a central supporting substrate typical of conventional interconnects. The columns 120 may be placed on tight pitches, and the pitches are not dependent on limitations in manufacturing (such as drilling holes in) a central supporting substrate. Other manufacturing processes are possible in alternative embodiments, including casting or forming the columns 120 and then attaching the columns 120 to the lower holder 124.

In an exemplary embodiment, the columns 120 extend into the openings 140, 160 of the upper and lower substrates 130, 150 to directly engage the upper and lower pads 132, 152, and the upper and lower substrates 130, 150 provide lateral support for the columns 120 to prevent the columns 120 from moving side-to-side. The upper substrate 130 captures the first ends 126 of the columns 120. The lower substrate 150 captures the second ends 128 of the columns 120. The centers or intermediate portions of the columns 120 are not supported by, or devoid of, any other support structure, but rather the columns 120 are only supported at the ends 126, 128.

The columns 120 each include a top section 170, a mid-section 172 and a bottom section 174, each generally ⅓ of the column 120. The top section 170 is supported by the upper holder 122 and the bottom section 174 is supported by the lower holder 124. The mid-section 172 is not supported by any insulator or substrate. The mid-sections 172 are able to bulge outward when the columns 120 are compressed. The mid-sections 172 are separated by air gaps and are not tied together. In an exemplary embodiment, a compression gap 176, defined between the upper substrate 130 and the lower substrate 150, is completely filled with air surrounding the columns 120. Alternatively, the compression gap 176 may be filled with an insulative material, such as a foam material, to provide some lateral support for the columns 120, but still allow compression of the columns 120 without holding the columns 120.

The first electrical component 102 is configured to be removably coupled to the interconnect device 106 at a separable interface defined between the first electrical component 102 and the upper holder 122. The upper pads 132 define a cap or barrier between the columns 120 and the mating contacts 200. Preferably, the interconnect device 106 is configured for many mating and unmating cycles. For example, the first electrical component 102 may be readily mated and unmated from the interconnect device 106. In an exemplary embodiment, the interconnect device 106 defines a testing device that tests many different electrical components, such as electronic packages or chips. For example, the interconnect device 106 may define a burn-in socket used to test chips at high heat. The upper holder 122 defines a separable interface for mating with such electronic components. The upper pads 132 may be mated and unmated from mating contacts 202 of the first electrical component 102 numerous times with minimal fatigue or damage to the upper pads 132. The upper pads 132 do not bond or adhere to the mating contacts 202, such that the mating contacts 202 may be readily unmated from the upper pads 132.

Optionally, during use of the electrical interconnect system 100, heat is generated which may cause the columns 120, at the first and second ends 126, 128 to bond to the upper and lower pads 132, 152. The bond between the pads 132, 152 and the elastomeric columns 120 remains largely, if not entirely, undisturbed when the first electrical component 102 is removed from the interconnect device 106 or when the interconnect device 106 is removed from the second electrical component 104. The ends 126 of the elastomeric columns 120 are not damaged or degraded during mating and unmating of the first electrical component 102 with the interconnect device 106.

In an alternative embodiment, rather than having a separate lower holder and second electrical component, the columns 120 and the upper holder 122 may be mounted directly to the second electrical component 104. The second electrical component 104 may thus define a lower holder covering the array of conductive elastomeric columns. For example, the second electrical component 104 includes a lower substrate and a plurality of discrete lower pads held by the lower substrate and arranged in a complementary pattern to the array of elastomeric columns with the lower pads capping corresponding second ends of the elastomeric columns. The columns 120 may be formed in place on the second electrical component 104 and then the upper holder 122 may be positioned over the array of columns 120 and secured thereto, such as by being bonded or adhered to the columns 120.

In an alternative embodiment, the first electrical component 102 may have a ball grid array at the mating interface. The upper holder 122 may be rotated 180° so that the upper substrate 130 is above the upper pads 132 with the openings 140 above the upper pads 132. The openings 140 may be upward facing to create a pocket for receiving the solder balls of the ball grid array of the first electrical component 102. The lower holder 124 may similarly be flipped 180° for mounting to a ball grid array.

Figure 4:
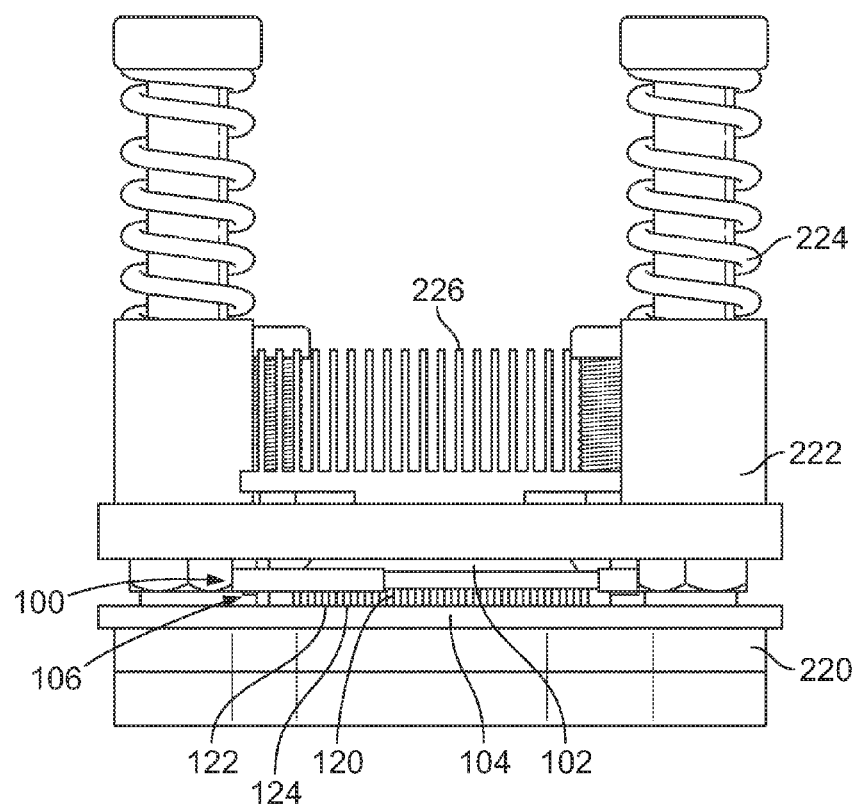
FIG. 4 is a side view of the electrical interconnect system showing the interconnect device between the first electrical component and the second electrical component.

FIG. 4 is a side view of the electrical interconnect system 100 showing the interconnect device 106 sandwiched between the first electrical component 102 and the second electrical component 104. The second electrical component 104 is mounted on a fixture 220. A compression device 222 is mounted over the electrical interconnect system 100. The compression device 222 is coupled to the fixture 220 using springs 224 that provide a downward, compressive force on the first electrical component 102. A heat sink 226 is positioned in thermal contact with the first electrical component 102 to dissipate heat therefrom. The compression device 222 presses the first electrical component 102 into the interconnect device 106, which presses the interconnect device into the second electrical component 104. The columns 120 are compressed between the upper and lower holders 122, 124. The columns 120 create electrical paths between the first and second electrical components 102, 104. In an exemplary embodiment, the compression device 222 limits forces in a vertical direction and ensures that no shear forces are imparted on the interconnect device 106.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. An electrical interconnect device for connecting a first electrical component with a second electrical component, the electrical interconnect device comprising:
   an array of conductive elastomeric columns, each of the elastomeric columns extending between a first end and a second end, the elastomeric columns being internally conductive between the first and second ends;
   an upper holder covering the array of conductive elastomeric columns, the upper holder having an upper substrate and a plurality of discrete upper pads held by the upper substrate and arranged in a complementary pattern to the array of elastomeric columns, the discrete upper pads capping corresponding first ends of the elastomeric columns for engaging mating contacts of the first electrical component; and
   a lower holder covering the array of conductive elastomeric columns, the lower holder having a lower substrate and a plurality of discrete lower pads held by the lower substrate and arranged in a complementary pattern to the array of elastomeric columns, the discrete lower pads capping corresponding second ends of the elastomeric columns for engaging mating contacts of the second electrical component;
   wherein the upper and lower holders support the array of conductive elastomeric columns as an electrical interconnect device configured to be positioned between, and electrically interconnect, the first and second electrical components.

2. The electrical interconnect device of claim 1, wherein the elastomeric columns are contained between the upper and lower holders and the elastomeric columns are supported only by the upper and lower holders.

3. The electrical interconnect device of claim 1, wherein the electrical interconnect device is devoid of a central supporting substrate supporting and holding the elastomeric columns between the upper substrate and the lower substrate.

4. The electrical interconnect device of claim 1, wherein a compression gap is defined between the upper and lower substrates, the compression gap surrounding the elastomeric columns, the compression gap being filled with foam.

5. The electrical interconnect device of claim 1, wherein the elastomeric columns each include a top section, a mid-section, and a bottom section each generally ⅓ of the elastomeric column between the first and second ends, the top sections being held by the upper holder, the bottom sections being held by the lower holder, the mid-sections unsupported and unheld relative to each other.

6. The electrical interconnect device of claim 1, wherein the elastomeric columns each include a top section, a mid-section and a bottom section each generally ⅓ of the elastomeric columns between the first and second ends, the mid-sections being free of a central supporting substrate supporting and holding the elastomeric columns.

7. The electrical interconnect device of claim 1, further comprising air gaps surrounding the elastomeric columns along the entire length between the upper substrate and the lower substrate.

8. The electrical interconnect device of claim 1, wherein the upper substrate comprises a flexible film, and wherein the lower substrate comprises a flexible film.

9. The electrical interconnect device of claim 1, wherein the discrete upper pads are held together by the upper substrate, and wherein the discrete lower pads are held together by the lower substrate.

10. The electrical interconnect device of claim 1, wherein the upper substrate comprises an upper surface and a lower surface, the upper substrate having an array of openings therethrough, the discrete upper pads being deposited on the upper surface over corresponding openings, the first ends of the elastomeric columns extending into corresponding openings to engage corresponding discrete upper pads.

11. The electrical interconnect device of claim 1, wherein the elastomeric columns bulge outward at mid-sections thereof when the upper holder is subjected to a compressive force.

12. An electrical interconnect device for connecting a first electrical component with a second electrical component, the electrical interconnect device comprising:

an array of conductive elastomeric columns, each of the elastomeric columns extending between a first end and a second end, the elastomeric columns being internally conductive between the first and second ends;

a lower holder covering the array of conductive elastomeric columns, the lower holder having a lower substrate and a plurality of discrete lower pads held by the lower substrate and arranged in a complementary pattern to the array of elastomeric columns, the discrete lower pads capping corresponding second ends of the elastomeric columns for engaging mating contacts of the second electrical component;

an upper holder covering the array of conductive elastomeric columns, the upper holder having an upper substrate and a plurality of discrete upper pads held by the upper substrate and arranged in a complementary pattern to the array of elastomeric columns, the discrete upper pads capping corresponding first ends of the elastomeric columns for engaging mating contacts of the first electrical component; and guide walls coupled to the upper holder, the guide walls defining a socket configured to receive an electronic package defining the first electrical component having an array of the mating contacts configured to be electrically connected to corresponding discrete upper pads;

wherein the array of conductive elastomeric columns is contained between the upper and lower holders and the array of conductive elastomeric columns are supported and held only by the upper and lower holders such that the electrical interconnect device is configured to be positioned between, and electrically interconnect, the first and second electrical components.

13. The electrical interconnect device of claim 12, wherein the elastomeric columns are contained between the upper and lower holders and the elastomeric columns are supported and held only by the upper and lower holders.

14. The electrical interconnect device of claim 12, wherein the electrical interconnect device is devoid of a central supporting substrate supporting and holding the elastomeric columns between the upper substrate and the lower substrate.

15. The electrical interconnect device of claim 12, wherein a compression gap is defined between the upper and lower substrates, the compression gap surrounding the elastomeric columns, the compression gap being filled with air.

16. The electrical interconnect device of claim 12, wherein the elastomeric columns each include a top section, a mid-section, and a bottom section each generally ⅓ of the elastomeric column between the first and second ends, the top sections being held by the upper holder, the bottom sections being held by the lower holder, the mid-sections unsupported relative to each other.

17. The electrical interconnect device of claim 12, wherein the elastomeric columns each include a top section, a mid-section and a bottom section each generally ⅓ of the elastomeric columns between the first and second ends, the mid-sections being free of a central supporting substrate supporting and holding the elastomeric columns.

18. The electrical interconnect device of claim 12, further comprising air gaps surrounding the elastomeric columns along the entire length between the upper substrate and the lower substrate.

19. The electrical interconnect device of claim 12, wherein the upper substrate comprises a flexible film, and wherein the lower substrate comprises a flexible film.

20. The electrical interconnect device of claim 12, wherein the upper substrate comprises an upper surface and a lower surface, the upper substrate having an array of openings therethrough, the discrete upper pads being deposited on the upper surface over corresponding openings, the first ends of the elastomeric columns extending into corresponding openings to engage corresponding discrete upper pads.

* * * * *